(12) United States Patent
Hsieh et al.

(10) Patent No.: US 8,710,560 B2
(45) Date of Patent: Apr. 29, 2014

(54) EMBEDDED BONDING PAD FOR IMAGE SENSORS

(75) Inventors: Yuan-Chih Hsieh, Hsinchu (TW);
Shih-Chang Liu, Kaohsiung County (TW); Shih-Chi Fu, Taipei (TW);
Tzu-Hsuan Hsu, Kaohsiung (TW);
Chung-Yi Yu, Hsin-Chu (TW);
Gwo-Yuh Shiau, Hsinchu (TW);
Chia-Shiung Tsai, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1100 days.

(21) Appl. No.: 11/835,814

(22) Filed: Aug. 8, 2007

(65) Prior Publication Data
US 2009/0039452 A1 Feb. 12, 2009

(51) Int. Cl.
*H01L 31/062* (2012.01)
(52) U.S. Cl.
USPC .......................................................... 257/292

(58) Field of Classification Search
USPC .......... 257/291, 292, 294, 432, 459, E27.132, 257/E27.133, E27.134
See application file for complete search history.

(56) References Cited

U.S. PATENT DOCUMENTS

| | | | |
|---|---|---|---|
| 6,872,584 B2 * | 3/2005 | Nakashiba | 438/22 |
| 2003/0022413 A1 * | 1/2003 | Nakashiba | 438/64 |
| 2006/0113622 A1 * | 6/2006 | Adkisson et al. | 257/443 |
| 2008/0111159 A1 * | 5/2008 | Gambino et al. | 257/225 |
| 2008/0246063 A1 * | 10/2008 | Liu et al. | 257/290 |

* cited by examiner

*Primary Examiner* — Vongsavanh Sengdara
(74) *Attorney, Agent, or Firm* — Haynes and Boone, LLP

(57) ABSTRACT

A semiconductor device includes a semiconductor substrate having a front surface and a back surface, elements formed on the substrate, interconnect metal layers formed over the front surface of the substrate, including a topmost interconnect metal layer, an inter-metal dielectric for insulating each of the plurality of interconnect metal layers, and a bonding pad disposed within the inter-metal dielectric, the bonding pad in contact with one of the interconnect metal layers other than the topmost interconnect metal layer.

20 Claims, 15 Drawing Sheets

EMBEDDED BONDING PAD FOR IMAGE SENSORS

BACKGROUND

The present disclosure relates generally to semiconductor devices and, more particularly, to image sensors having an embedded bonding pad.

In semiconductor technologies, image sensors are used for sensing a volume of exposed light projected towards a semiconductor substrate. Complementary metal-oxide-semiconductor (CMOS) image sensors (CIS) and charge-coupled device (CCD) sensors are widely used in various applications such as digital still camera applications. These devices utilize an array of pixels or light-sensing elements, including photodiodes and transistors, to collect photo energy to convert images into electrical signals. In order to capture color information, image sensors may employ a color filter layer that incorporates several different color filters (e.g., red, green, and blue), and are positioned such that the incident light is directed through the filter via a micro-lens. The color filter layer and micro-lens are formed at a top surface of the image sensors.

However, bonding pads are also formed near the top surface of the image sensors for use in wafer level testing and wire bonding during chip packaging. As such, a profile or topography of the bonding pad may adversely effect the process of forming the color filter layer and micro-lens. Further, the thickness of the bonding pad adds to the distance that light must travel in order to reach the pixels and, thus, may degrade a photosensitivity of the image sensors.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
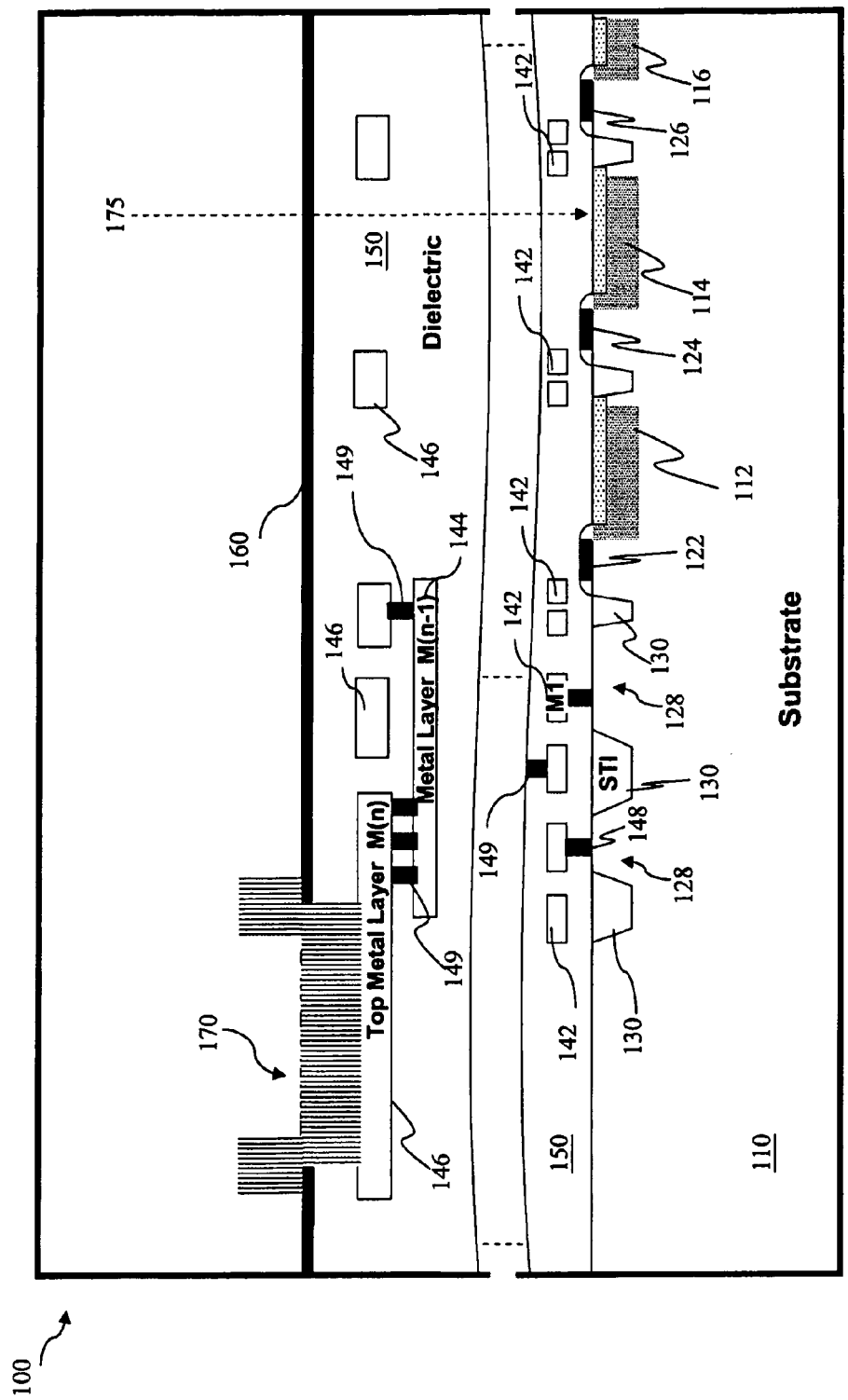
FIG. 1 is a cross-sectional view of a semiconductor device having a plurality of light-sensing elements.

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a cross-sectional view of a semiconductor device 100 having a plurality of light-sensing elements formed on a semiconductor substrate 110. The semiconductor substrate 110 may include a silicon substrate in a crystalline structure. The substrate 110 may also include other elementary semiconductors such as germanium. Alternatively, the substrate 110 may optionally include a compound semiconductor such as silicon carbide, gallium arsenic, indium arsenide, and indium phosphide. Also, the substrate 110 may optionally include an epitaxial layer (epilayer) formed by an epitaxial growth process.

The light-sensing elements may be formed by CMOS processing techniques known in the art. In the disclosed embodiment, the light-sensing elements may be configured as an active pixel which includes a photodiode 112, 114, 116 and at least one transistor 122, 124, 126. The photodiode 112, 114, 116 may include a pinned layer photodiode for absorbing light radiation and generating optical charges or photo-electrons that are collected and accumulated. The transistor 122, 124, 126 may be configured to readout the generated photo-electrons and convert them into an electrical signal. Additionally, the semiconductor device 100 may further include various active and passive micro-electronic elements 128 that provide an operation environment for the light sensing elements. It is understood that other configurations for the light-sensing element may be implemented. For example, the light sensing elements may be configured as a 4T active pixel including a photodiode and four transistors (e.g., transfer gate transistor, reset transistor, source follower transistor, and select transistor) or configurations using 4T operating concepts (e.g., sharing reset transistor and source follower transistor for several pixels) may be used for the light sensing elements.

The semiconductor device 100 may further comprise a plurality of isolation features 130 such as shallow trench isolation (STI) features. The isolation features 130 may define and isolate active regions for the various elements of the semiconductor device 100. The isolation features 130 may be formed in the semiconductor substrate 110 by a suitable process known in the art. For example, the STI features may be formed by patterning the substrate 110 by photolithography, etching the substrate by plasma etching to form various trenches, and filling the trenches with a dielectric material such as silicon oxide by a chemical vapor deposition (CVD) process. The CVD process may utilize a high density plasma CVD (HDPCVD) to achieve a better planar surface of the STI features. The STI features may further include an oxide layer lining the side walls.

The semiconductor device 100 may further comprise a plurality of interconnect metal layers (or multi-layer interconnect structure) for providing connections between the various elements of the semiconductor device and between the interconnect metal layers themselves. The number of interconnect metal layers may vary depending on the design of the particular semiconductor device. In the disclosed embodiment, the interconnect metal layers may include (n)

metal layers with interconnect metal layer (M1) 142, . . . interconnect metal layer (M(n−1)) 144, and interconnect metal layer (M(n)) 146. The interconnect metal layer (M(n)) 146 is the topmost metal layer. The interconnect metal layers 142, 144, 146 may include conductive materials such as aluminum, aluminum/silicon/copper alloy, titanium, titanium nitride, tungsten, polysilicon, metal silicide, or combinations thereof. Alternatively, the interconnect metal layers 142, 144, 146 may include copper, copper alloy, titanium, titanium nitride, tantalum, tantalum nitride, tungsten, polysilicon, metal silicide, or combinations thereof.

The interconnect metal layer (M1) 142 may include various contacts or vias 148 that are configured to couple the active regions in the substrate 110 to the metal layer (M1). The interconnect metal layers 142, 144, 146 may include various contacts or vias 149 that are configured to couple one metal layer to other metal layers. The interconnect metal layers 142, 144, 146 may be disposed and insulated from each other in an inter-metal dielectric 150. The inter-metal dielectric 150 may include a material of a low dielectric constant such as a dielectric constant less than about 3.5. The inter-metal dielectric 150 may include silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, SiLK (Dow Chemical, Midland, Mich.), polyimide, and/or other suitable materials. The inter-metal dielectric 150 may be formed by a technique including spin-on, CVD, or sputtering. The interconnect metal layers 142, 144, 146 and inter-metal dielectric 150 may be formed in an integrated process such as a damascene process or lithography/plasma etching process known in the art.

The semiconductor device 100 may further include a passivation layer 160 formed over the topmost metal layer (M(n)) 146 and inter-metal dielectric 150 to cover and protect the interconnect metal layers. The passivation layer 160 may include silicon oxide, silicon nitride, silicon oxynitride, or combinations thereof. The passivation layer 160 may be formed by CVD, spin-coating, or other suitable techniques.

The semiconductor device 100 may further include a bonding pad 170 formed on the topmost metal layer (M(n)) 146. The bonding pad 170 may be formed within the passivation layer 160 and inter-metal dielectric 150 by a process known in the art. The bonding pads 170 may be configured to provide an electrical connection with the top metal layer (M(n)) for wafer level testing, wiring, or chip packaging. The bonding pad 170 may include an electrically conductive material such as aluminum, aluminum alloy, copper, copper alloy, or combinations thereof. The profile or topography of the bonding pad 170 may have a step height of more than 8,000 Å in order to achieve adequate bonding properties. However, this step height may have an adverse effect on the process of forming the color filter layer and micro-lens due to the non-planar profile of the bonding pad 170. Furthermore, a photosensitivity of the semiconductor device 100 may be degraded due to a longer distance that light has to travel 175 in order to reach the light sensing elements on the substrate 110.

Figure 2:
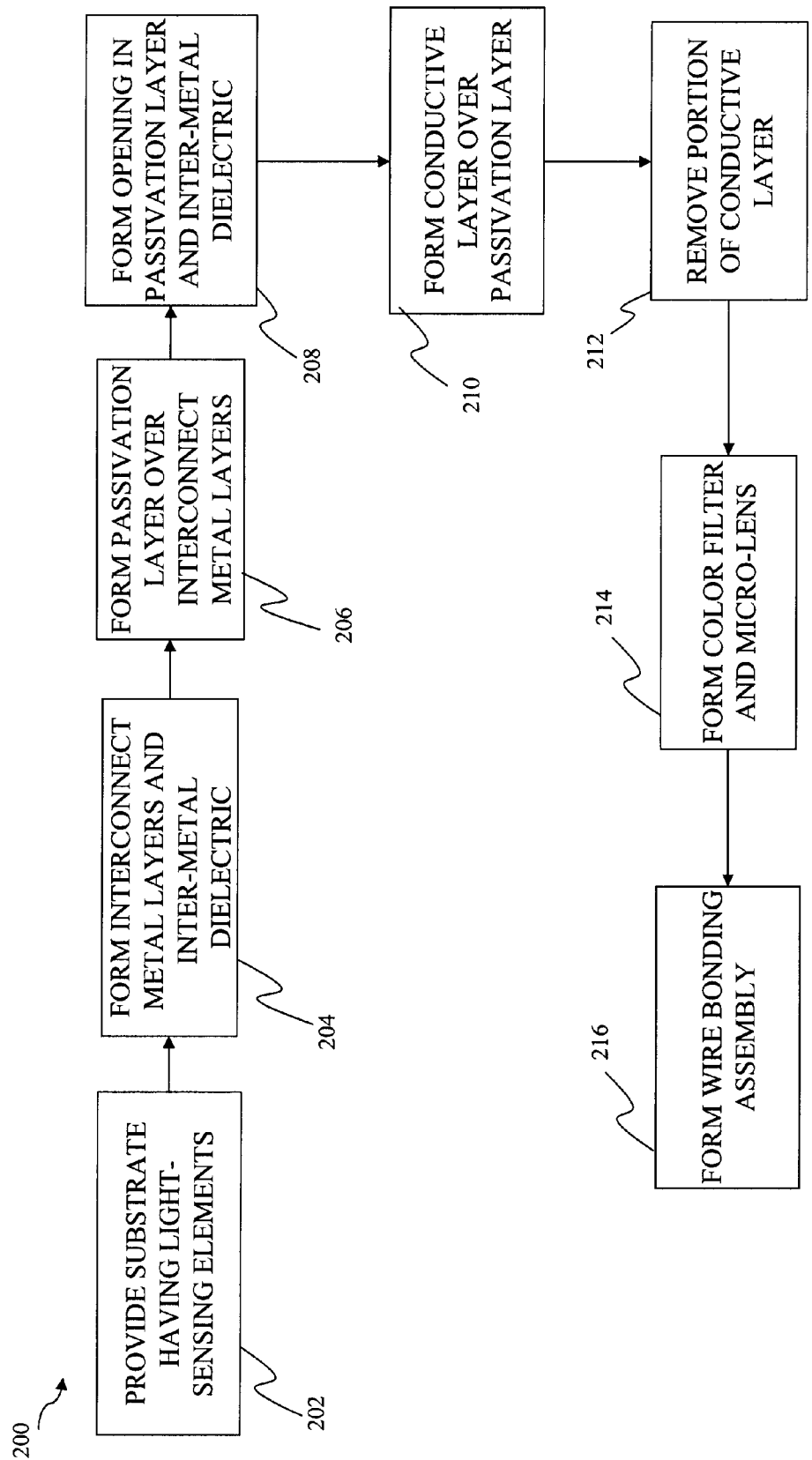
FIG. 2 is a flowchart of a method for fabricating a semiconductor device that embodies aspects of the present disclosure.
Figure 3A:
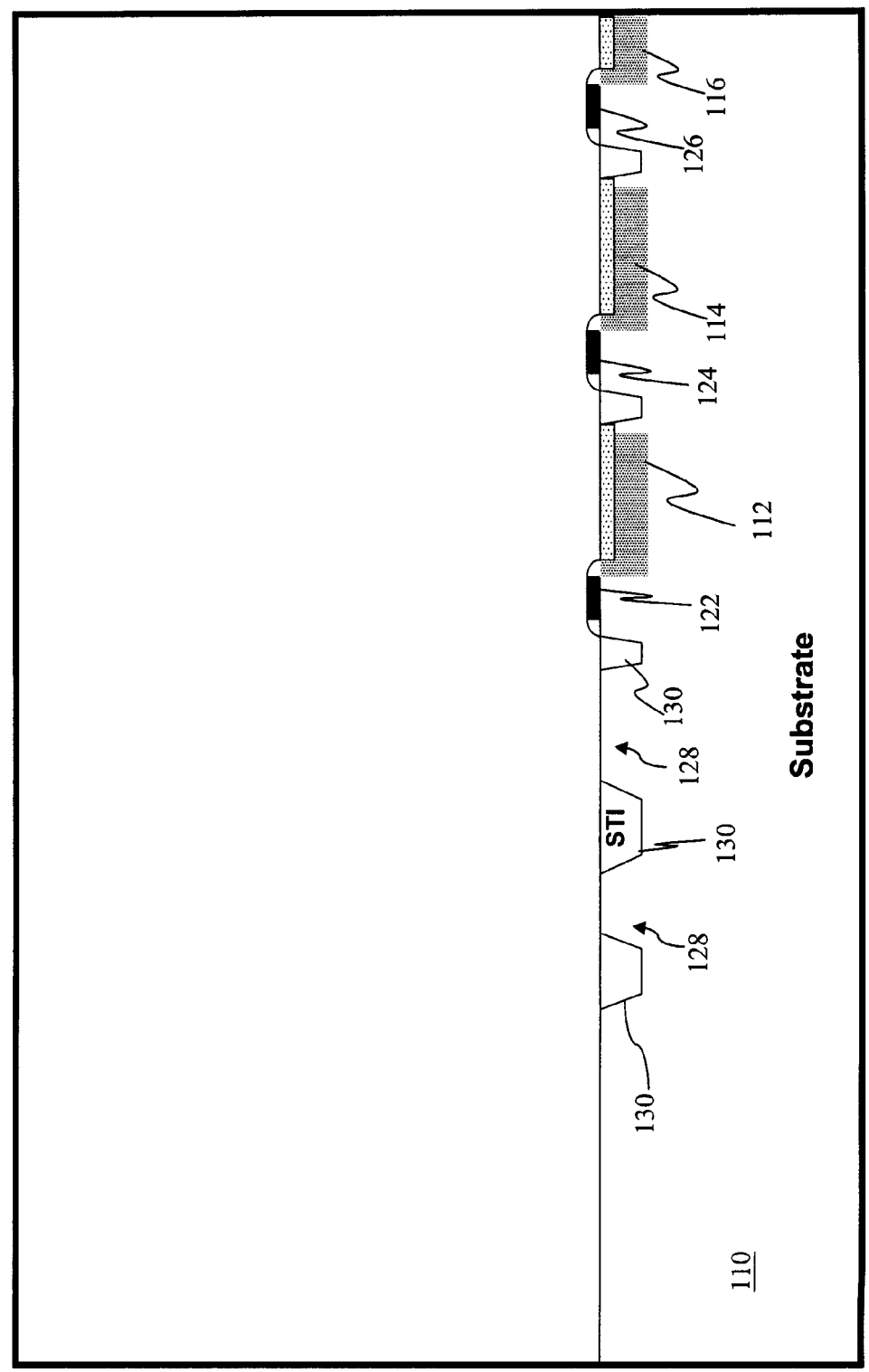
FIGS. 3A through 3H are cross-sectional views of the semiconductor device being processed according to the method of FIG. 2.

Referring to FIGS. 2 and, 3A through 3H, illustrated is flowchart for a method 200 of fabricating a semiconductor device 300, and cross-sectional views of the semiconductor device 300 being processed at various stages according to the method 200. The semiconductor device 300 is similar to the semiconductor device 100 of FIG. 1 except for the features described below. Similar features in FIGS. 1 and 3 are numbered the same for clarity. In FIG. 3A, the method 200 begins with step 202 in which a semiconductor substrate 110 may be provided with a plurality of light-sensing elements formed thereon. The light-sensing elements may be formed with CMOS processing techniques known in the art. The light-sensing elements may each include a photodiode 112, 114, 116 and at least one transistor 122, 124, 126. The semiconductor device 300 may further include various active and passive elements 128 formed on the substrate 110 to provide an operation environment for the light-sensing elements and to support external communications with the semiconductor device 300. The substrate 110 may include isolation features 130 that define and isolate active regions for the various elements of the semiconductor device 300.

Figure 3B:
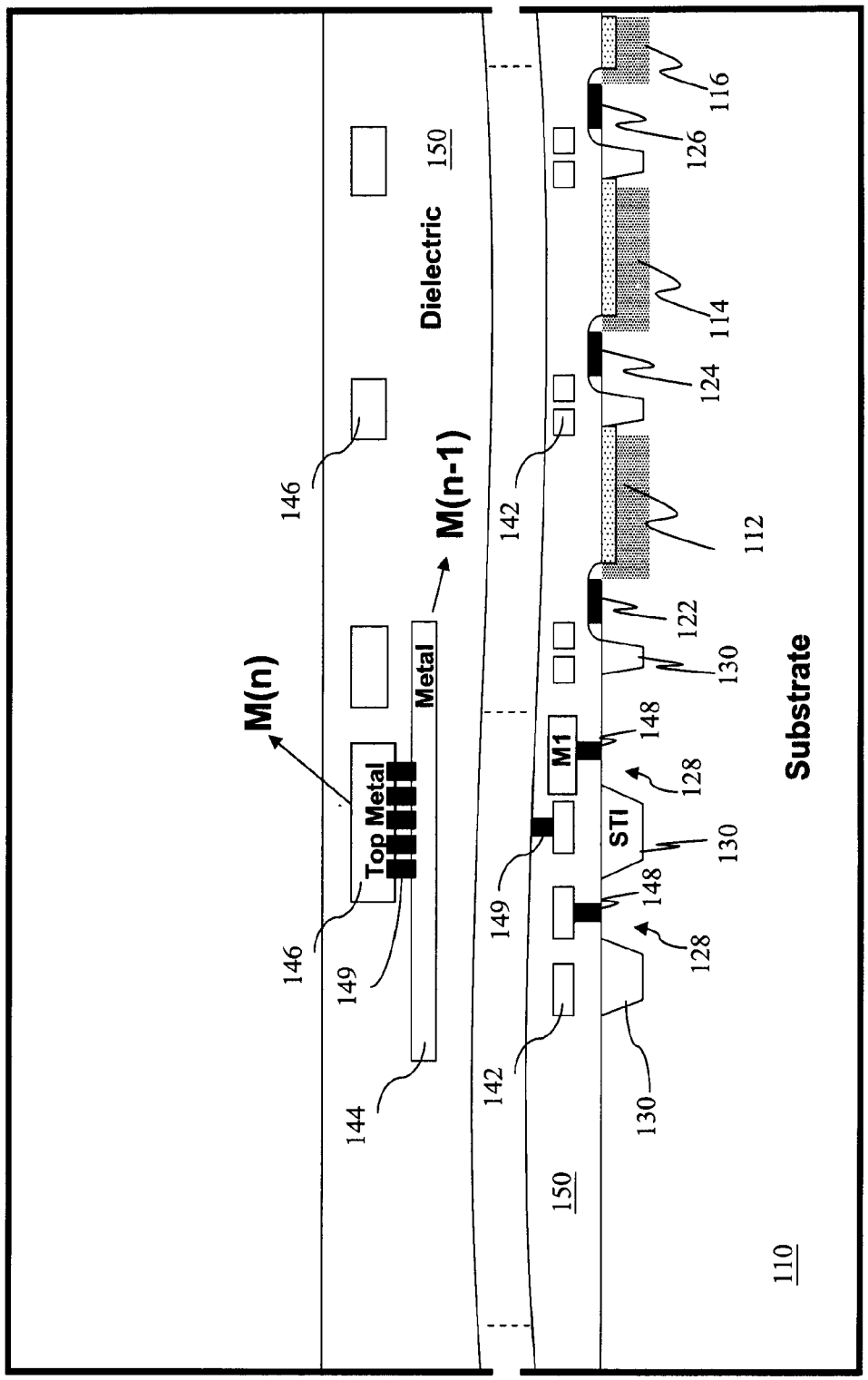

In FIG. 3B, the method 200 continues with step 204 in which a plurality of interconnect metal layers may be formed for connecting the various elements on the substrate 110 and for connecting between the metal layers themselves. The interconnect metal layers may include (n) metal layers with interconnect metal layer (M1) 142, . . . interconnect metal layer (M(n−1)) 144, and interconnect metal layer (M(n)) 146. The interconnect metal layer (M(n)) 146 is the topmost metal layer. The interconnect metal layer (M1) 142 may include various contacts or vias 148 that are configured to couple the active regions in the substrate 110 to the metal layer (M1). The interconnect metal layers 142, 144, 146 may include various contacts or vias 149 that are configured to couple one metal layer to other metal layers. For example, the topmost metal layer (M(n)) 146 may be coupled to the adjacent metal layer (M(n−1) 144 by vias 149. The metal layers 142, 144, 146 and inter-metal dielectric 150 may be formed in an integrated process such as a damascene process or lithography/plasma etching process known in the art and thus, not described in detail here.

Figure 3C:
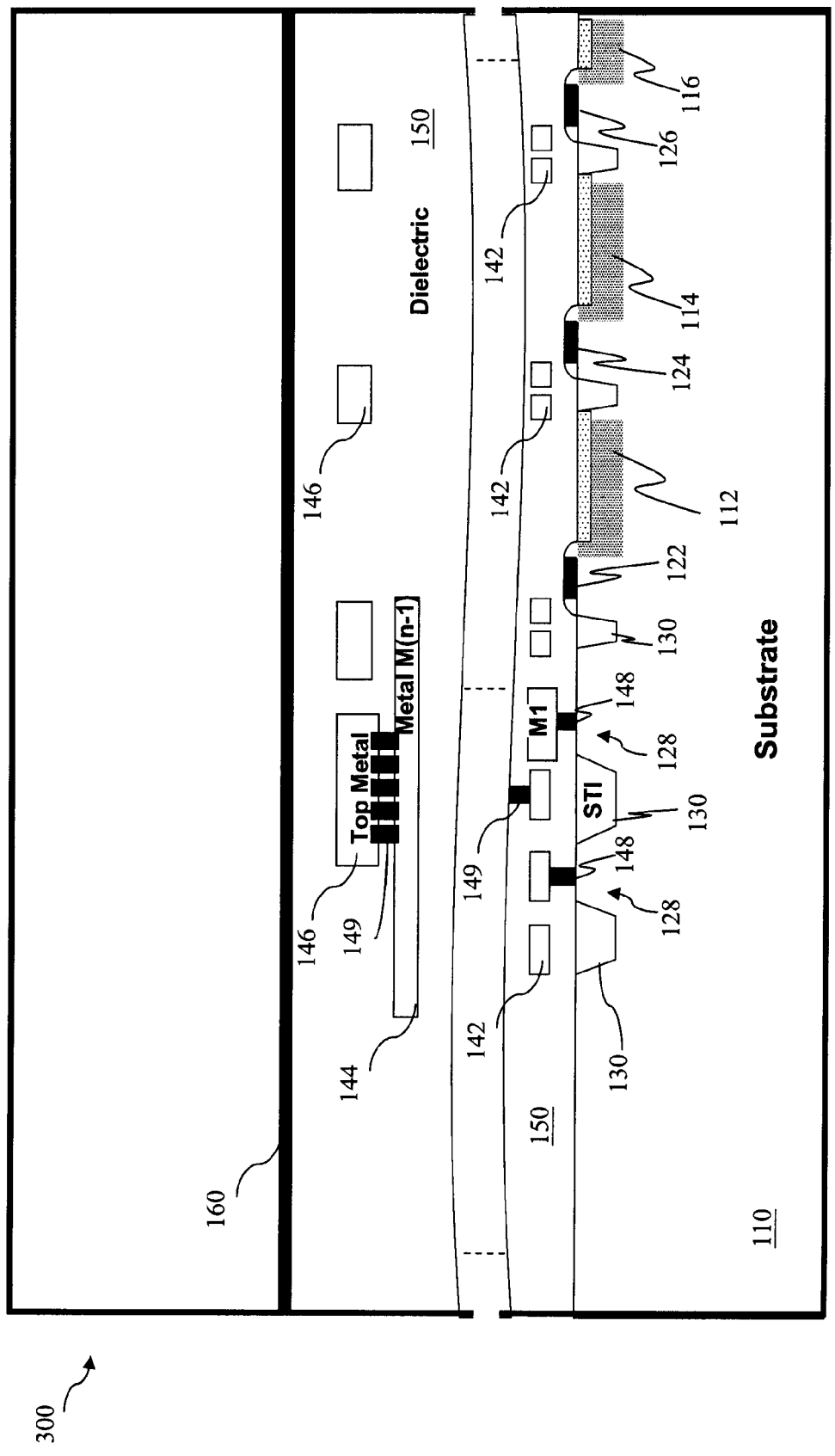

In FIG. 3C, the method 200 continues with step 206 in which a passivation layer 160 may be formed over the topmost metal layer (M(n)) 146 and inter-metal dielectric 150 to cover and protect the interconnect metal layers. The passivation layer 160 may include silicon oxide, silicon nitride, silicon oxynitride, or combinations thereof. The passivation layer 160 may be formed by CVD, spin-coating, or other suitable techniques.

Figure 3D:
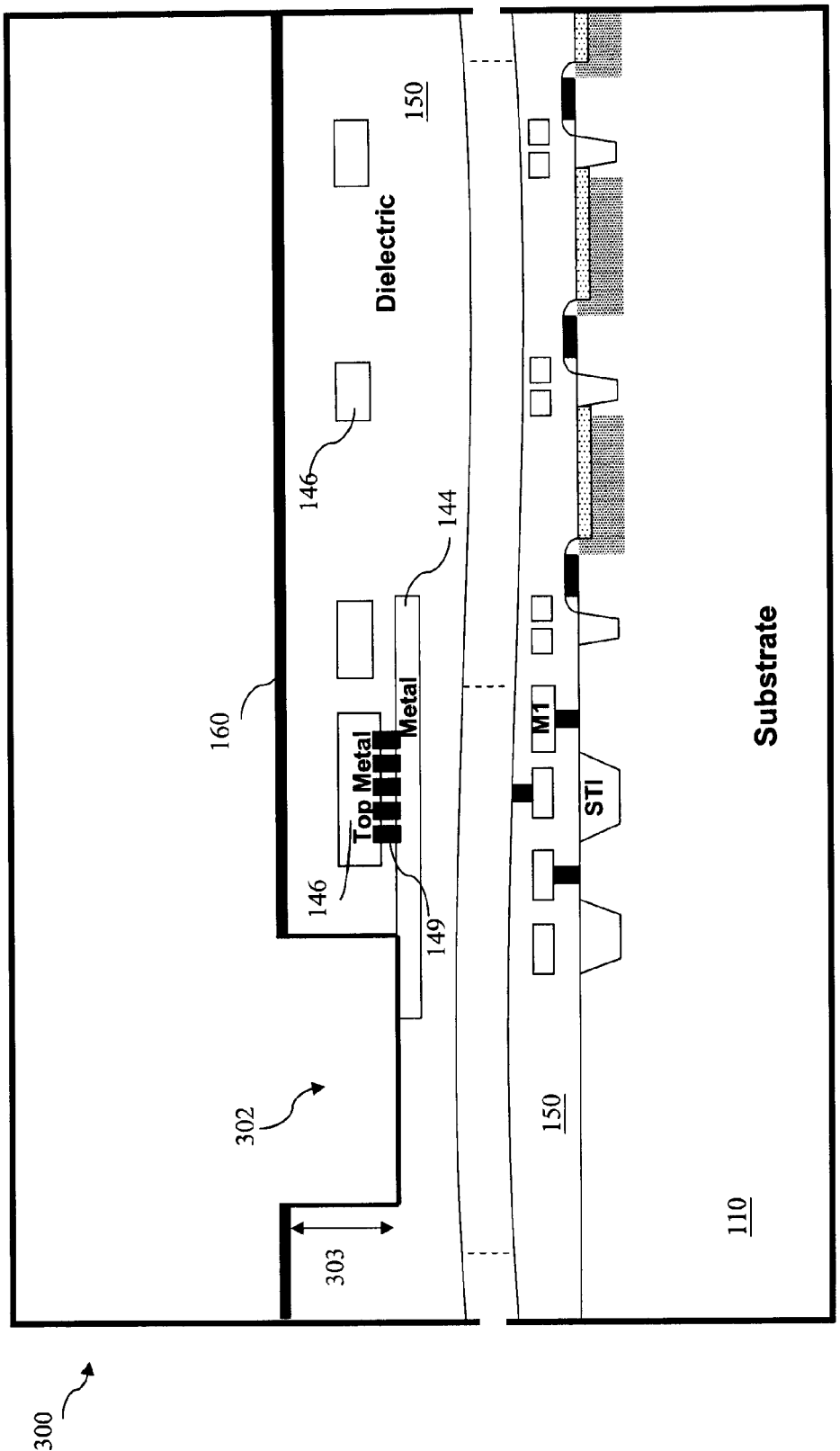

In FIG. 3D, the method 200 continues with step 208 in which an opening 302 may be formed within the passivation layer 160 and inter-metal dielectric 150. The opening 302 may extend to and communicate with one of the interconnect metal layers 142, 144 other than the topmost interconnect metal layer (M(n)) 146. In the disclosed embodiment, the opening 302 may extend to and communicate with the interconnect metal layer (M(n−1)) 144 that is adjacent to the topmost interconnect metal layer 146. The opening 302 may have a thickness 303 of about 1 µm. Alternatively, the thickness may be greater than 1 µm in some embodiments. The opening 302 may be formed by patterning with photolithography and etching. The process of patterning and etching are known in the art and, thus not described in detail here.

Figure 3E:
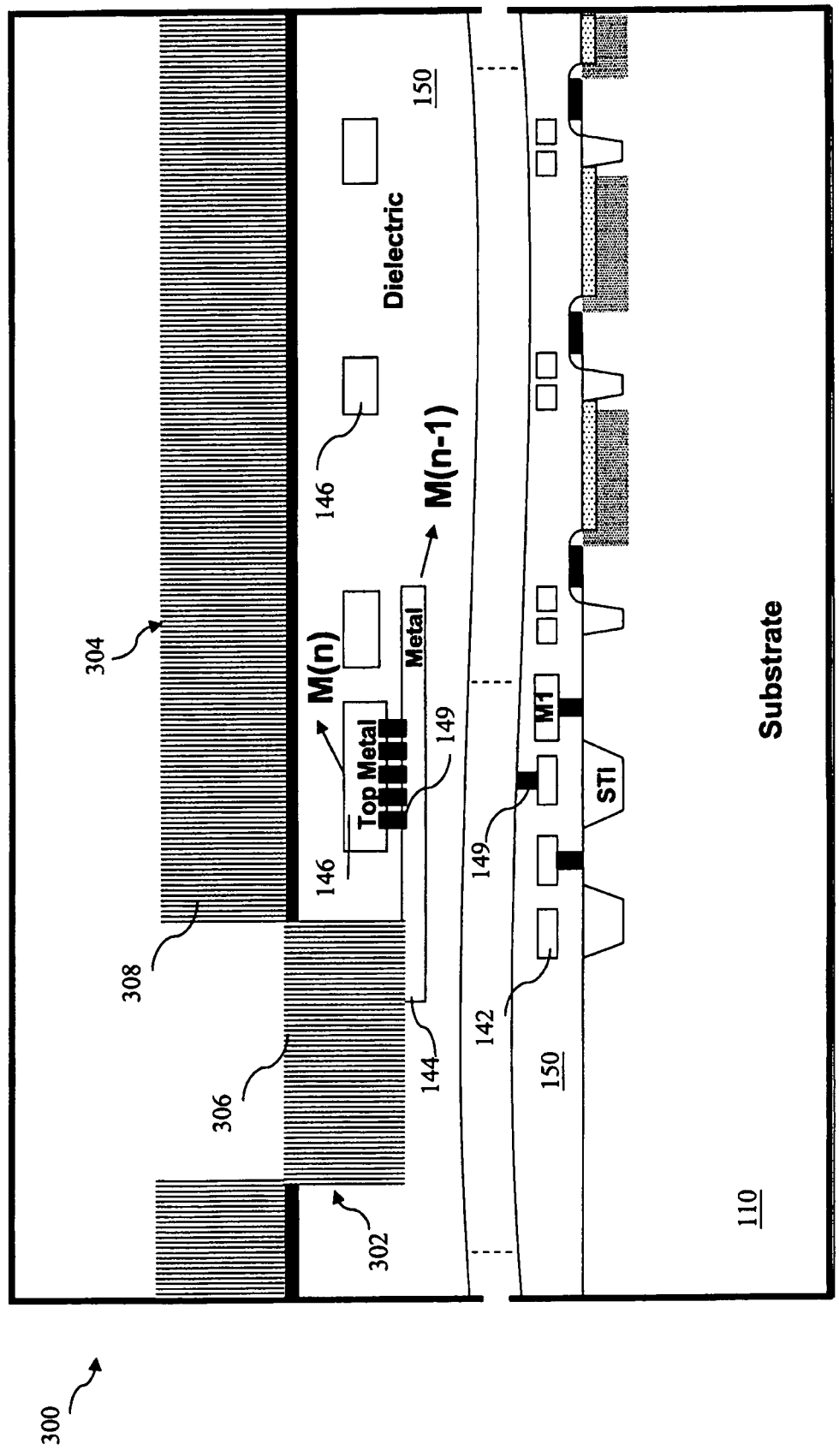

In FIG. 3E, the method 200 continues with step 210 in which a conductive layer 304 may be formed over the passivation layer 160 including the opening 302. As such, there may be a portion 306 of the conductive layer 304 that fills the opening 302 and another portion 308 overlying the passivation layer 160. The conductive layer 304 may be formed by physical vapor deposition (PVD), CVD, sputtering, plating, or other suitable processes. The conductive layer 304 may include aluminum, aluminum alloy, copper, copper alloy, or combinations thereof.

Figure 3F:
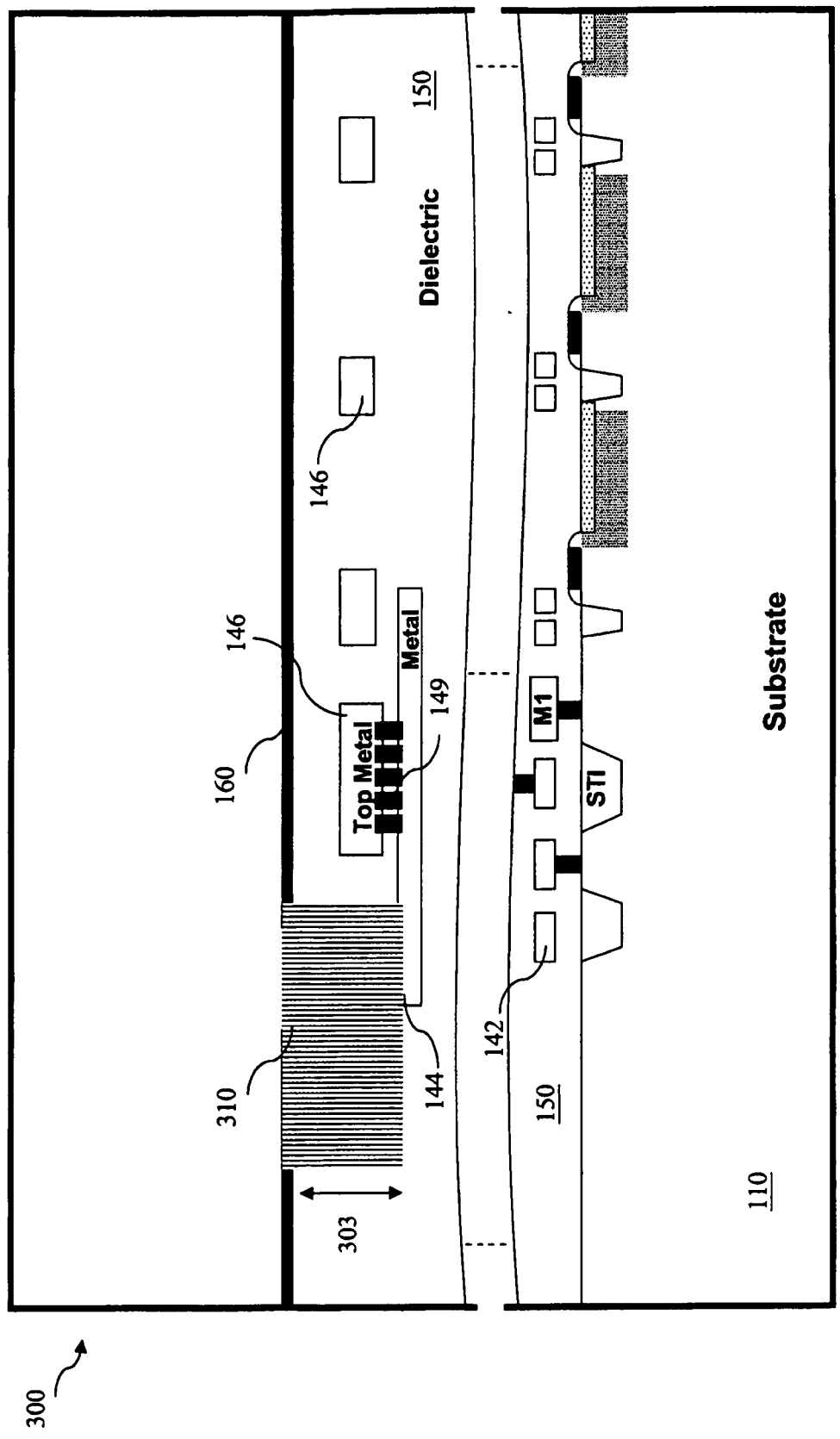

In FIG. 3F, the method 200 continues with step 212 in which the portion 308 of the conductive layer 304 may be removed to form a bonding pad 310. The portion 308 conductive layer 304 may be removed with chemical mechanical planarization (CMP). The CMP process utilizes both mechanical grinding and chemical etching for removing the portion 308 of the conductive layer 304 so that the bonding pad 310 is co-planar with the passivation layer 160. Alternatively, the portion 308 of the conductive layer 304 may be removed by a plasma etch process. The smooth and planar surface of the passivation layer 160 including the bonding pad 310 provides an excellent profile for further processing that follows. The bonding pad 310 may have substantially the same thickness 303 as the opening 302.

Figure 3G:
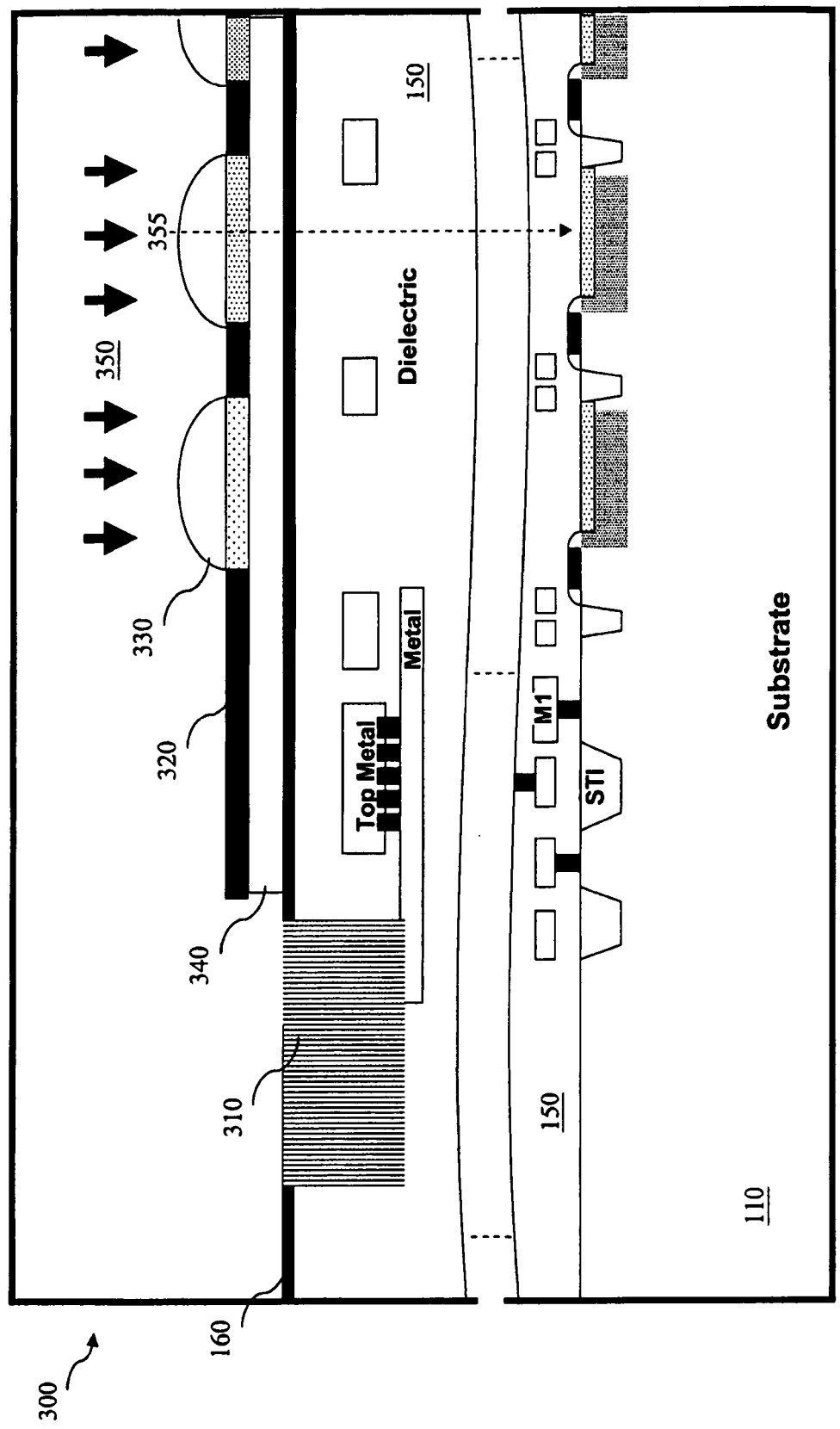

In FIG. 3G, the method 200 continues with step 214 in which a color filter layer 320 and micro-lens 330 may be formed overlying the passivation layer 160. A buffer coating layer 340 known in the art may first be formed over the passivation layer 160. The color filter layer 320 and micro-lens 330 are configured for filtering and directing light radiation 350 towards the light-sensing elements on the substrate 110 during operation. In the present embodiment, a distance 355 that light 350 travels in order to reach the light-sensing elements on the substrate 110 is reduced since the top surface of bonding pad 310 and passivation layer 160 are co-planar.

Figure 3H:
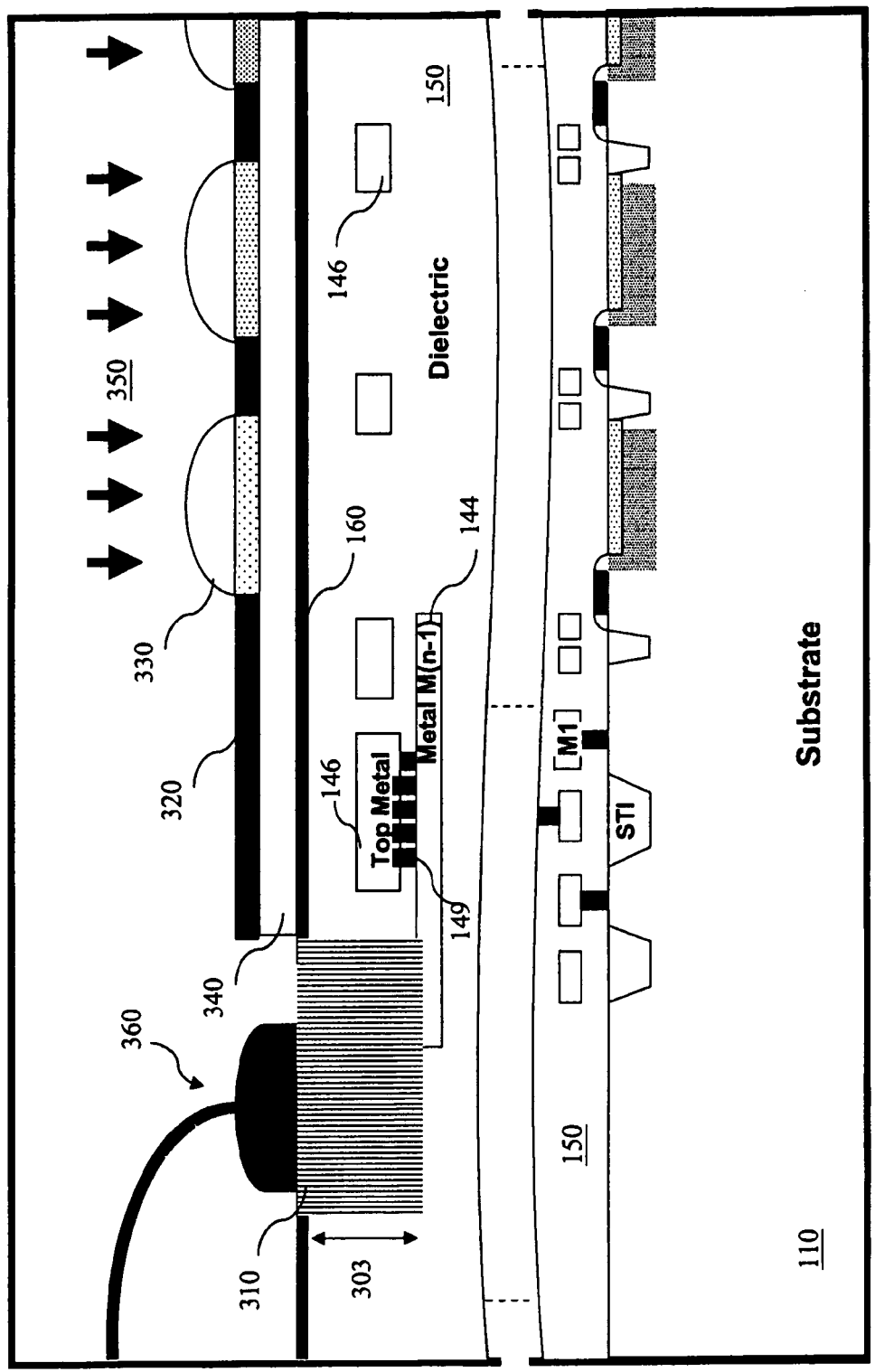

In FIG. 3H, the method 200 continues with step 216 in which a wire bonding assembly 360 may be formed in contact with the bonding pad 310. It is understood that an opening for the bonding pad 310 may formed after formation of the color filter layer and micro-lens in the previous Step 214. The wire bonding assembly 360 may be formed by various wire bonding techniques such as thermosonic bonding and thermocompression bonding. The thickness 303 of the bonding pad 310 provides adequate bonding properties for the various bonding techniques. The wire bonding assembly 360 may be used in wafer level testing, wiring, or chip packaging.

Figure 4:
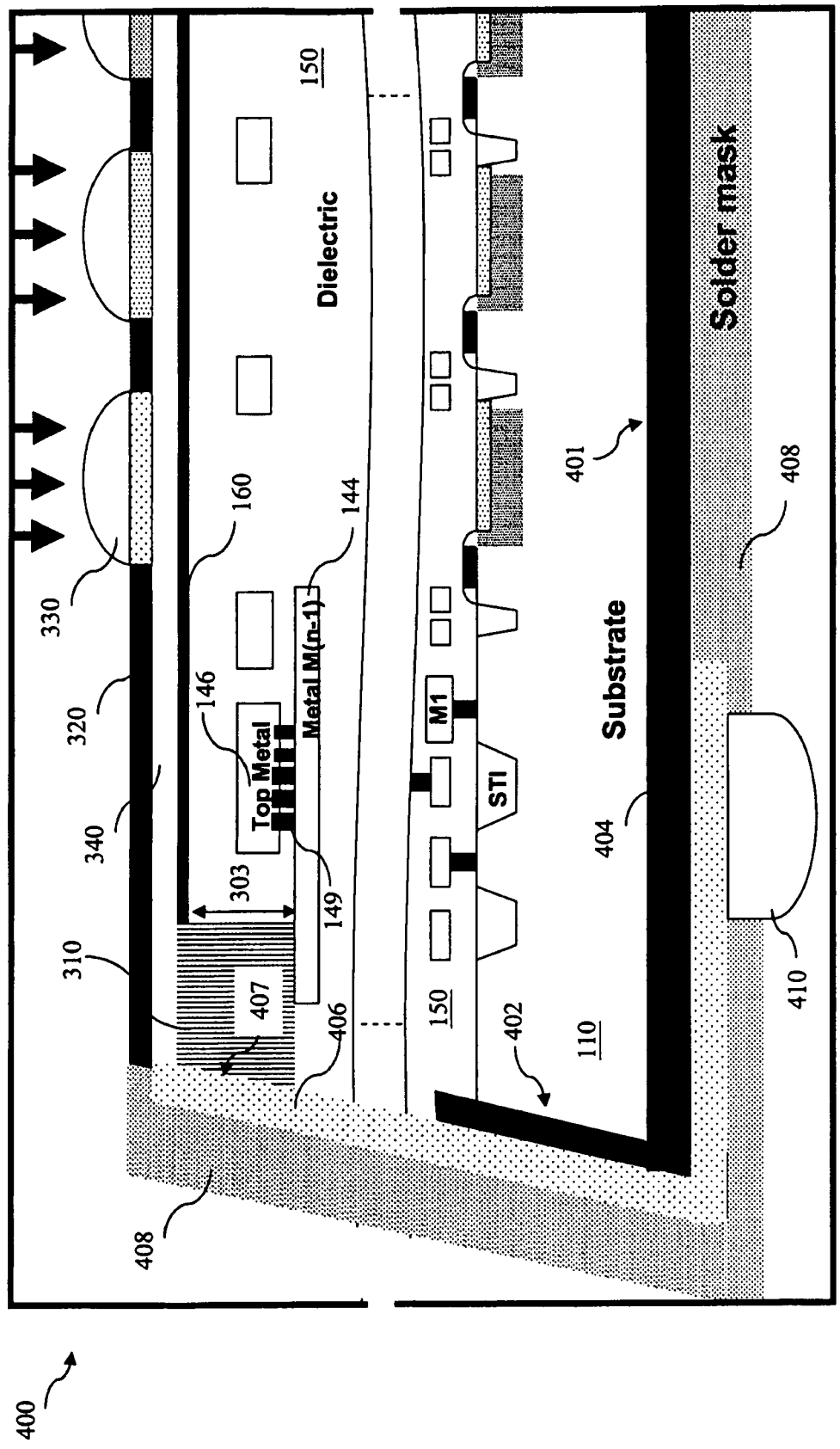
FIG. 4 is a cross-sectional view of a semiconductor device that is an alternative embodiment of the semiconductor device of FIG. 3.
Figure 5:
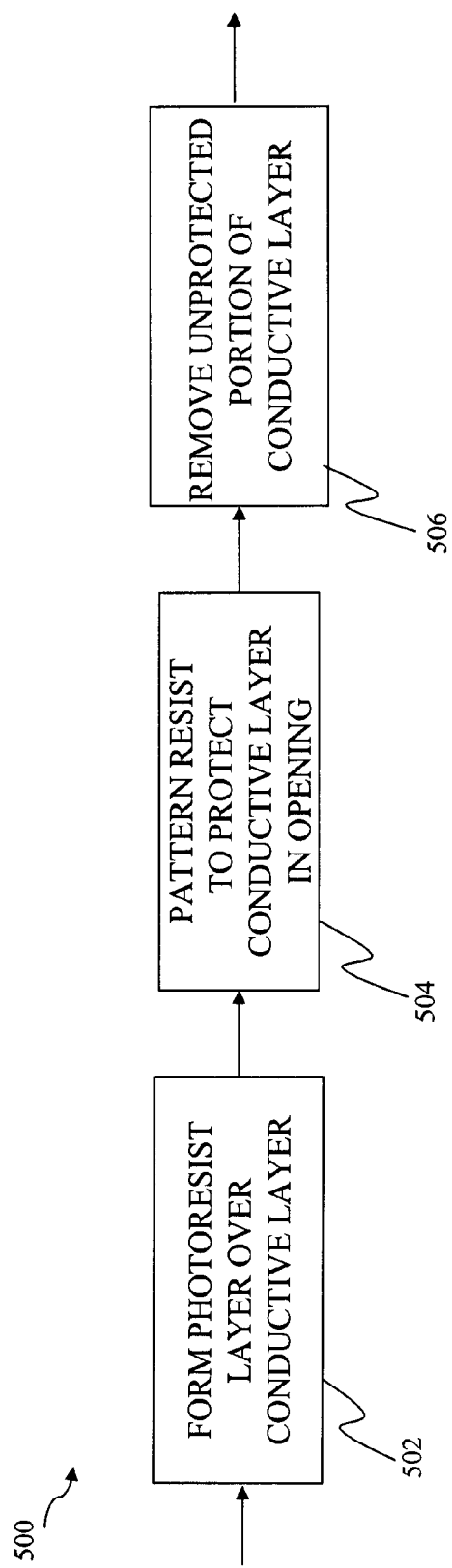
FIG. 5 is a flowchart of a method for fabricating a semiconductor device that is an alternative embodiment of the method of FIG. 2.

Referring to FIG. 4, illustrated is a cross-sectional view of an alternative embodiment of a semiconductor device 400 having a sidewall contact assembly. The semiconductor device 400 is similar to the semiconductor device 300 of FIG. 3 except for the features described below. Similar features in FIGS. 3 and 4 are numbered the same for clarity. The semiconductor device 400 may include a bonding pad 310 that has been formed according to the method 200 of FIG. 2. The back surface 401 and side surface 402 of the substrate 110 may be protected by a passivation layer 404 known in the art. The sidewall contact assembly may include an electrically conductive deep sidewall 406 in contact with a side 407 of the bonding pad 310 and extending to the back surface 401 of the substrate 110. The deep sidewall 406 may be formed by a damascene technique or other suitable process.

The sidewall contact assembly may further include a solder mask 408 covering the sidewall 406 and back surface of the substrate 110. The solder mask 408 may provide protection for the sidewall 406. The sidewall contact assembly may further include a solder ball 410 formed in contact with the sidewall 406. The solder ball 408 may be formed partially within the solder mask 408 on the back surface of the substrate 110. The solder ball 410 may provide electrical connections to the bonding pad 310 via the deep sidewall 406. The thickness 303 of the bonding pad 310 enhances the reliability and electrical performance of the sidewall contact assembly for chip level packaging.

Referring to FIGS. 5, and 6A through 6C, illustrated are a flowchart of another embodiment of a method 500 for fabricating a semiconductor device 600, and cross-sectional views of the semiconductor device 600 being processed at various stages according to the method 500. The method 500 is similar to the method 200 of FIG. 2 except for steps described below. Also, the semiconductor device 600 is similar to the semiconductor device 300 of FIG. 3 except for the features described below. Similar features in FIGS. 3 and 6 are numbered the same for clarity. The method 500 may include Steps 202 through 210 of FIG. 2. As previously discussed, a conductive layer 304 may be formed over the passivation layer 160 including the opening 302. As such, there may be a portion 306 of the conductive layer 304 that fills the opening 302 and another portion 308 overlying the passivation layer 160. The conductive layer 304 may be formed by physical vapor deposition (PVD), CVD, sputtering, plating, or other suitable processes. The conductive layer 304 may include aluminum, aluminum alloy, copper, copper alloy, or combinations thereof.

Figure 6A:
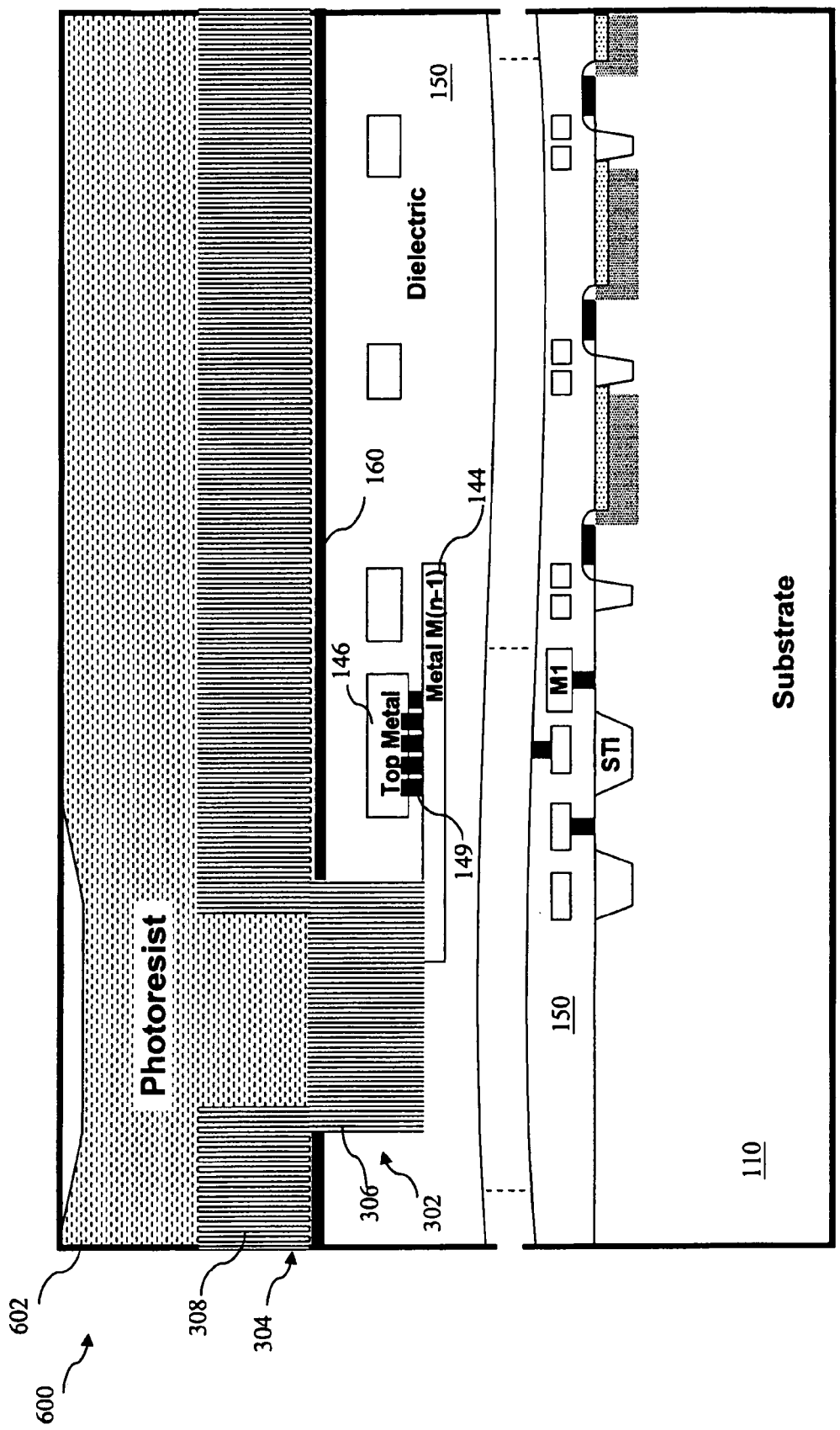
FIGS. 6A through 6C are cross-sectional views of the semiconductor device being processed according to the method of FIG. 5.

In FIG. 6A, the method 500 continues with step 502 in which a photoresist layer 602 may be formed over the conductive layer 304. The photoresist layer 602 may be formed by a spin-coating process known in the art.

Figure 6B:
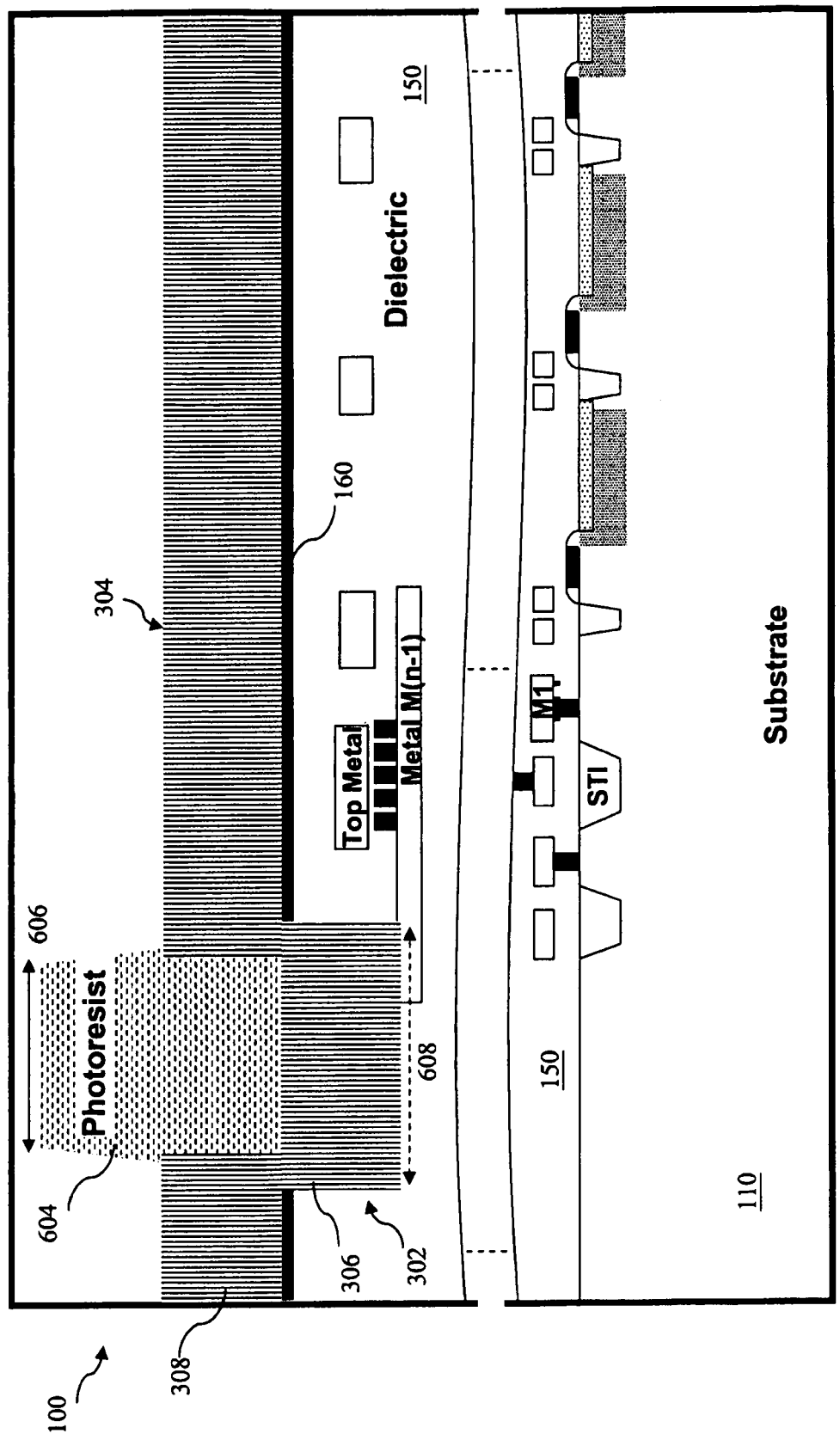

In FIG. 6B, the method 500 continues with step 504 in which the photoresist layer 602 may be patterned to form a photomask 604 protecting the portion 306 of the conductive layer 304 within the opening 302. The photoresist layer 602 may be patterned by photolithography. The photomask 604 may have a width 606 that is smaller than a width 608 of the opening 302. Alternatively, the photoresist layer 602 may be patterned with the same mask that was used to form the opening 302 (but with a different type of photoresist material).

Figure 6C:
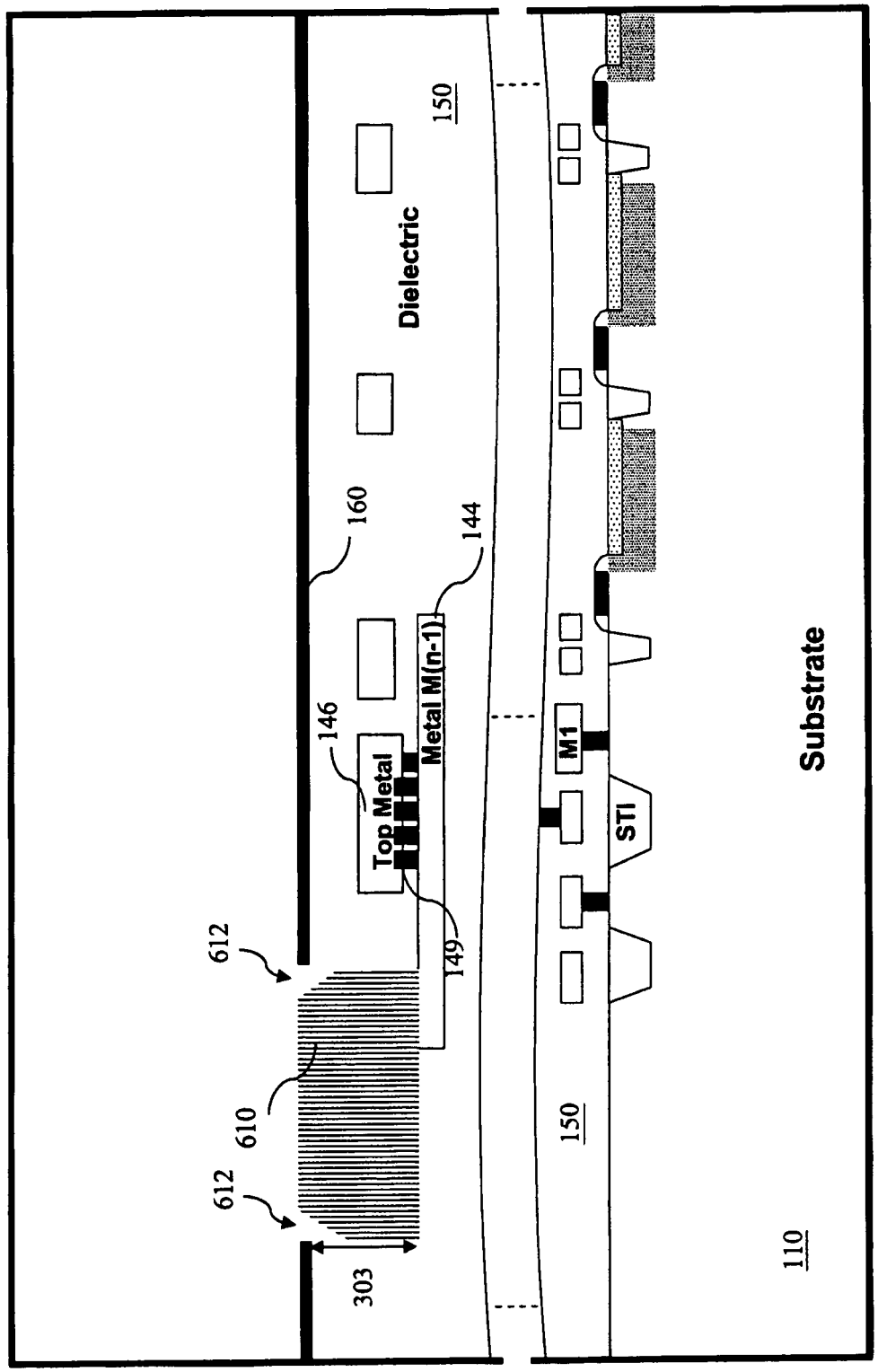

In FIG. 6C, the method 500 continues with step 506 in which the unprotected portions of the conductive layer 304 may be removed by an etching process. The etching process may include a plasma etch process. The plasma etch process may utilize a metal etch species that selectively etches the conductive layer 304 until the passivation layer 160 is exposed. That is, the passivation layer 160 may be used an etch stop layer. Following the etching process, a bonding pad 610 may be formed within the passivation layer 160 and inter-metal dielectric 150. The bonding pad 610 may be co-planar with the passivation layer 160. The thickness 303 of the bonding pad 610 is substantially similar to the bonding pad 310 of FIG. 1. Also, the boning pad 610 may include sloped sidewalls 612 due to the etching process. The method 500 may continue with further processing steps (Steps 214 and 216) as was described in FIG. 2.

In the disclosed embodiment, the light radiation that may be received during operation may not be limited to visual light (e.g., red, green, blue light), but can be extended to other types of light radiation such as infrared (IR) and ultraviolet (UV) light. Accordingly, the light-sensing elements and various other active and passive elements may be properly designed and configured for effectively reflecting and/or absorbing the corresponding light radiation beam.

Thus, provided is a semiconductor device including a semiconductor substrate having a front surface and a back surface; a plurality of elements formed on the substrate; a plurality of interconnect metal layers formed over the front surface of the substrate, including a topmost interconnect metal layer; an inter-metal dielectric for insulating each of the plurality of interconnect metal layers disposed therein; and a bonding pad disposed within the inter-metal dielectric, the bonding pad in contact with one of the plurality of interconnect metal layers other than the topmost interconnect metal layer. In some embodiments, the one of the plurality of interconnect metal layers is coupled to the topmost metal layer by a via. In some other embodiments, the semiconductor device further includes a passivation layer formed over the topmost interconnect metal layer and inter-metal dielectric, the passivation layer partially surrounding the bonding pad; an array of color filters formed over the passivation layer, each color filter allowing a wavelength of light radiation to reach at least one element; and an array of micro-lens formed over the array of color filters, each micro-lens being adapted for directing light radiation to at least one of the color filters. Each of the elements includes a light-sensing element.

In other embodiments, the semiconductor device further includes a wire bonding assembly in contact with the bonding pad. In some other embodiments, the semiconductor device further includes a deep sidewall in contact with the bonding pad; a solder mask formed over the sidewall and back surface of the substrate; and a second bonding pad disposed partially within the solder mask overlying the back surface of the substrate, the second bonding pad electrically coupled with the sidewall. In some other embodiments, the second bonding pad includes a solder ball pad. In still other embodiments, the bonding pad includes one of an aluminum, aluminum alloy, copper, copper alloy, and combinations thereof. In other embodiments, the bonding pad has a planar top surface. In some other embodiments, the bonding pad has a thickness greater than or equal to about 1 µm.

Additionally, the present disclosure provides a semiconductor device that includes a semiconductor substrate having a front surface and a back surface; a plurality of photo-devices formed on the front surface of the substrate; a plurality of metal layers formed over the front surface of the substrate, including a top-most metal layer; an inter-metal dielectric for insulting each of the plurality of metal layers disposed therein; a passivation layer formed over the topmost metal layer and inter-metal dielectric; and a bonding pad partially embedded within the passivation layer and inter-metal dielectric, the bonding pad in direct contact with the one of the plurality of metal layers except for the topmost metal layer. A surface of the bonding pad and a surface of the passivation layer are co-planar. In some embodiments, the semiconductor device further includes a color filter layer formed over the passivation layer, the color filter layer adapted for filtering a wavelength of light radiation through to the plurality of photo-devices; and a micro-lens layer formed over the color filter layer, the micro-lens layer adapted for directing light radiation to the color filter layer.

In some other embodiments, the semiconductor device further includes further comprising a wire bond assembly formed on the bonding pad. In other embodiments, the bonding pad has a thickness greater than or equal to about 1 µm. In still other embodiments, the semiconductor device further includes a deep sidewall in direct contact with the bonding pad and extending over a portion of the back surface of the substrate; a solder mask formed over the deep sidewall and back surface of the substrate; and a solder ball disposed partially within the solder mask overlying the back surface of the substrate, the solder ball in direct contact with the deep sidewall that extends over the portion of the back surface of the substrate. In other embodiments, the topmost metal layer is electrically coupled to the one of the plurality of metals that is in direct contact with the bonding pad. In some other embodiments, the bonding pad includes one of an aluminum, aluminum alloy, copper, copper alloy, and combinations thereof.

Also, the present disclosure provides an image sensor device including a substrate having a front surface and a back surface; a plurality of light-sensing elements formed on the substrate; a plurality of interconnect metal layers formed over the plurality of light-sensing element an inter-metal dielectric insulating each of the plurality of interconnect metal layers disposed therein; a passivation layer formed over the plurality of interconnect metal layers; a color filter layer formed over the passivation layer, the color filter layer being adapted to allow a wavelength of light radiation to pass through to each of the light-sensing element; a plurality of micro-lens formed over the color filter layer; and a bonding pad embedded in the passivation layer and inter-metal dielectric, the bonding pad in direct contact with one of the plurality of interconnect metal layers other than a topmost interconnect metal layer.

In some embodiments, the image sensor device further includes a wire bonding assembly in contact with the bonding pad. In some other embodiments, the image sensor device further includes a sidewall assembly in contact with the bonding pad and extending to the back surface of the substrate; a solder mask formed covering the sidewall assembly and back surface of the substrate; and a second bonding pad disposed partially within the solder mask overlying the back surface of the substrate, the second bonding pad in contact with the sidewall assembly. In some other embodiments, the topmost interconnect metal layer is electrically coupled to the one of the plurality of interconnect metal layers that is in direct contact with the bonding pad.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. It is understood that various different combinations of the above listed processing steps can be used in combination or in parallel. Also, features illustrated and discussed in some embodiments can be combined with features illustrated and discussed above with respect to other embodiments. Those skilled in the art should also realize that such equivalent constructions do not depart from the spirit and scope of the present disclosure, and that they may make various changes, substitutions and alterations herein without departing from the spirit and scope of the present disclosure. For example, various features and the doping configurations disclosed herein may be reversed accordingly.

Several different advantages exist from these and other embodiments. In addition to providing an efficient and cost-effective bonding pad for image sensors, the apparatus and method disclosed herein can easily be integrated with current semiconductor processing techniques and equipment. Also, the bonding pad disclosed herein is embedded within the passivation layer so that formation of the color filter layer and micro-lens may be easily performed over a smooth and planar surface. Further, the thickness of the bonding pad provides adequate bonding properties for wire bonding assemblies and sidewall contact assemblies used in chip level packaging. This enhances the electrical performance and reliability of the image sensor in chip level packaging.

What is claimed is:
1. A semiconductor device, comprising:
a semiconductor substrate having a front surface and a back surface;
a plurality of elements formed on the substrate;
a plurality of interconnect metal layers formed over the front surface of the substrate, including a topmost interconnect metal layer having a first topmost surface measured a first distance from the front surface of the substrate and a first bottommost surface measured a third distance from the front surface of the substrate;
an inter-metal dielectric for insulating each of the plurality of interconnect metal layers disposed therein; and
a bonding pad disposed within the inter-metal dielectric, the bonding pad in contact with one of the plurality of interconnect metal layers other than the topmost interconnect metal layer, the bonding pad having a second topmost surface measured a second distance from the front surface of the substrate and a second bottommost surface measured a fourth distance from the front surface of the substrate;

wherein:
the second distance is greater than the first distance;
the third distance is greater than the fourth distance; and
the first, second, third, and fourth distances are measured in a same direction.

2. The device of claim 1, wherein the one of the plurality of interconnect metal layers is coupled to the topmost metal layer by a via.

3. The device of claim 2, further comprising:
a passivation layer formed over the topmost interconnect metal layer and inter-metal dielectric, the passivation layer partially surrounding the bonding pad;
an array of color filters formed over the passivation layer, each color filter allowing a wavelength of light radiation to reach at least one element; and
an array of micro-lens formed over the array of color filters, each micro-lens being adapted for directing light radiation to at least one of the color filters;
wherein each of the elements includes a light-sensing element.

4. The device of claim 2, further comprising a wire bond assembly coupled to the bonding pad.

5. The device of claim 2, further comprising:
a deep sidewall in contact with the bonding pad;
a solder mask formed over the sidewall and back surface of the substrate; and
a second bonding pad disposed partially within the solder mask overlying the back surface of the substrate, the second bonding pad electrically coupled with the sidewall.

6. The device of claim 5, wherein the second bonding pad includes a solder ball pad.

7. The device of claim 1, wherein the bonding pad includes one of an aluminum, aluminum alloy, copper, copper alloy, and combinations thereof.

8. The device of claim 1, wherein the bonding pad has a planar top surface.

9. The device of claim 1, wherein the bonding pad has a thickness greater than or equal to about 1 µm.

10. A semiconductor device, comprising:
a semiconductor substrate having a front surface and a back surface;
a plurality of photo-devices formed on the front surface of the substrate;
a plurality of metal layers formed over the front surface of the substrate, including a topmost metal layer;
an inter-metal dielectric for insulating each of the plurality of metal layers disposed therein;
a passivation layer formed over the topmost metal layer and inter-metal dielectric; and
a bonding pad partially embedded within the passivation layer and inter-metal dielectric, the bonding pad in direct contact with the one of the plurality of metal layers except for the topmost metal layer;
wherein a surface of the bonding pad and a surface of the passivation layer are co-planar.

11. The device of claim 10, further comprising:
a color filter layer formed over the passivation layer, the color filter layer adapted for filtering a wavelength of light radiation through to the plurality of photo-devices; and
a micro-lens layer formed over the color filter layer, the micro-lens layer adapted for directing light radiation to the color filter layer.

12. The device of claim 11, further comprising a wire bond assembly formed on the bonding pad.

13. The device of claim 11, wherein the bonding pad has a thickness greater than or equal to about 1 µm.

14. The device of claim 13, further comprising:
a deep sidewall in direct contact with the bonding pad and extending over a portion of the back surface of the substrate;
a solder mask formed over the deep sidewall and back surface of the substrate; and
a solder ball disposed partially within the solder mask overlying the back surface of the substrate, the solder ball in direct contact with the deep sidewall that extends over the portion of the back surface of the substrate.

15. The device of claim 10, wherein the topmost metal layer is electrically coupled to the one of the plurality of metal layers that is in direct contact with the bonding pad.

16. The device of claim 10, wherein the bonding pad includes one of an aluminum, aluminum alloy, copper, copper alloy, and combinations thereof.

17. An image sensor device, comprising: a substrate having a front surface and a back surface; a plurality of light-sensing elements formed on the front surface of the substrate; a plurality of interconnect metal layers formed over the plurality of light-sensing elements; an inter-metal dielectric insulating each of the plurality of interconnect metal layers disposed therein; a passivation layer formed over the plurality of interconnect metal layers; a color filter layer formed over the passivation layer, the color filter layer being adapted to allow a wavelength of light radiation to pass through to each of the plurality of light-sensing elements; a plurality of micro-lens formed over the color filter layer; and a bonding pad embedded in the passivation layer and inter-metal dielectric, the bonding pad being in direct contact with one of the plurality of interconnect metal layers other than a topmost interconnect metal layer;
wherein a surface of the bonding pad and a surface of the passivation layer are co-planar.

18. The device of claim 17, further comprising a wire bond assembly coupled to the bonding pad.

19. The device of claim 17, further comprising:
a sidewall assembly in contact with the bonding pad and extending to the back surface of the substrate;
a solder mask formed covering the sidewall assembly and back surface of the substrate; and
a second bonding pad disposed partially within the solder mask overlying the back surface of the substrate, the second bonding pad in contact with the sidewall assembly.

20. The device of claim 17, wherein the topmost interconnect metal layer is electrically coupled to the one of the plurality of interconnect metal layers that is in direct contact with the bonding pad.

* * * * *